United States Patent
Bhatia

(10) Patent No.: US 7,584,392 B2
(45) Date of Patent: Sep. 1, 2009

(54) TEST COMPACTION USING LINEAR-MATRIX DRIVEN SCAN CHAINS

(75) Inventor: Sandeep Bhatia, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 320 days.

(21) Appl. No.: 10/630,537

(22) Filed: Jul. 29, 2003

(65) Prior Publication Data

US 2004/0237014 A1 Nov. 25, 2004

Related U.S. Application Data

(60) Provisional application No. 60/473,380, filed on May 23, 2003.

(51) Int. Cl.
*G01R 31/28* (2006.01)
(52) U.S. Cl. .................. 714/726; 714/724
(58) Field of Classification Search .......... 714/718, 714/724, 726, 727, 729, 738, 30, 733, 734; 716/4
See application file for complete search history.

(56) References Cited

U.S. PATENT DOCUMENTS

| | | | |
|---|---|---|---|
| 6,079,040 A | | 6/2000 | Hom et al. |
| 6,114,892 A | * | 9/2000 | Jin .................. 327/202 |
| 6,158,032 A | * | 12/2000 | Currier et al. ........... 714/726 |
| 6,377,912 B1 | * | 4/2002 | Sample et al. .......... 703/28 |
| 6,418,545 B1 | | 7/2002 | Adusumilli |
| 6,455,336 B1 | * | 9/2002 | Berndlmaier et al. ....... 438/14 |
| 6,574,762 B1 | * | 6/2003 | Karimi et al. ............ 714/727 |
| 6,694,464 B1 | * | 2/2004 | Quayle et al. ........... 714/725 |
| 6,873,185 B2 | * | 3/2005 | Cox ..................... 326/47 |
| 6,901,544 B1 | | 5/2005 | Huth et al. |
| 7,111,209 B2 | * | 9/2006 | Rajski et al. ............. 714/718 |
| 2003/0204802 A1 | | 10/2003 | Sim |
| 2004/0078741 A1 | | 4/2004 | Morton |
| 2005/0015689 A1 | * | 1/2005 | Eppensteiner et al. ....... 714/724 |

FOREIGN PATENT DOCUMENTS

JP 2003-202362 7/2003

OTHER PUBLICATIONS

Balakrishnan, K. J., et al., "*Deterministic Test Vector Decompression in Software Using Linear Operations*", Proceedings of the 21st IEEE VLSI Test Symposium, Apr. 27-May 1, 2003, pp. 225-231, IEEE, Los Alamitos, CA, USA.
Bardell, P. H. et al., "*Build-in Test for VLSI: Pseudorandom Techniques*", 1987, pp. 61-313, John Wiley and Sons, New York, USA.
Bhatia, S., "*Test Compaction by Using Linear-Matrix Driven Scan Chains*", Proceedings of the 18th IEEE International Symposium on Defect and Fault Tolerance in VLSI Systems, Nov. 3-5, 2003, pp. 185-190, IEEE, USA.
Bhatia, S., "*Test Compaction in a Parallel Access Scan Environment*", Proceedings of the 6th Asian Test Symposium (ATS '97), Nov. 17-19, 1997, pp. 300-305, IEEE, Los Alamitos, CA, USA.
Hellebrand, S., et al., "*Generation of Vector Patterns Through Reseeding of Multiple-Polynomial Linear Feedback Shift Registers*", Proceedings of the International Test Conference, 1992, pp. 120-124, France.

(Continued)

Primary Examiner—Phung M Chung
(74) Attorney, Agent, or Firm—Vista IP Law Group, LLP.

(57) ABSTRACT

A scan technique using linear matrix to drive scan chains is used, along with an ATPG, to constraint scan test vectors to be generated through the linear matrix. The linear matrix scan technique reduces the test application time and the amount of test vector data by several orders of magnitude over conventional techniques, without reducing fault coverage.

12 Claims, 3 Drawing Sheets

Hsu, F. F. et al., "*A Case Study on the Implementation of the Illinois Scan Architecture*", Proceedings of the International Test Conference; 2001, pp. 538-547, International Test Conference, Washington, D.C., USA.

Jaramillo, K. et al., "10 *Tips for Successful Scan Design: Part One*"; Feb. 17, 2000, endmag.com, pp. 67-73, 75; USA.

Jaramillo, K. et al., "10 *Tips for Successful Scan Design: Part Two*"; Feb. 17, 2000, endmag.com, pp. 77, 78, 80, 82, 84, 86, 88, 90; USA.

Kiefer, G. et al., "*Deterministic BIST with Multiple Scan Chains*", Proceedings of the International Test Conference, 1998, pp. 1057-1064, International Test Conference, Washington, D.C., USA.

Krishna, C.V. et al., "*Reducing Test Data Volume Using LFSR Reseeding with Seed Compression*", Proceedings of the International Test Conference, 2002, pp. 321-330, International Test Conference, Washington, D.C., USA.

McCluskey, E. J., "*Test Data Compression*", Design & Test of Computers, Mar.-Apr. 2003, pp. 76-87, vol. 20, Issue 2, IEEE Computer Society and the IEEE Circuits and Systems Society, USA.

Rajski, J. et al., "*Embedded Deterministic Test for Low Cost Manufacturing Test*", Proceedings of the International Test Conference, 2002, pp. 310-310, International Test Conference, Washington, D. C., USA.

\* cited by examiner

TEST COMPACTION USING LINEAR-MATRIX DRIVEN SCAN CHAINS

CROSS-REFERENCE TO RELATED APPLICATION

This application claims the benefit of U.S. Provisional Application No. 60/473,380, filed May 23, 2003.

FIELD OF THE INVENTION

The invention is related to the field of testing integrated circuits.

BACKGROUND OF THE INVENTION

Design for Testability (DFT) is an important requirement for today's complex application specific integrated circuit (ASIC) designs. DFT techniques allow one to perform high quality manufacturing tests after a chip has been synthesized, and to sort out good chips from bad ones. However, due to the ever increasing complexity of today's designs, the Automatic Test Equipment (ATE) tools required for testing are quite complex and expensive. As a result, manufacturing test costs have become a major part of the overall manufacturing cost of ASICs. Conventional testing approaches are unable to reduce this cost without sacrificing the test quality.

For example, the use of scan based Automatic Test Pattern Generation (ATPG) is a common DFT methodology that is widely used. Scan logic allows an internal sequential element of an ASIC, such as a flip-flop, to be controlled and observed during testing. The flip-flops are connected into several chains, called scan chains, which are usually accessed through test pins, as shown in FIG. 1. The test pins are normally shared with the functional chip pins. When testing is performed, the test vector data is applied through the chains to control the sequential state of the circuit to a desired state. After application of a test vector, the test response data is captured by the flip-flops. The response data is shifted out through the scan chains and is compared against the expected response to check if the chip is functioning correctly.

To achieve a high quality of the test, it is important to include most, if not all, of the flip-flops in the chip in the scan chains. The number of scan chains is usually limited to 16 or 32. The limit on the number of scan chains is bounded by the number of available input and output (I/O) pins that are able to access the chains, and by the number of scan-channels on an ATE used to drive the chains. Normally, one input and one output pin is required to access each chain. The chains are usually balanced as much as possible to minimize the length of the longest chain. The number of tester cycles required to shift data through a chain is determined by the length of the chain, i.e. by the number of flip-flops in the chain. Therefore, the length of the chains is limited to the number of pins, and the reduction in testing time is limited by the length of the chains. This conventional approach is inadequate for testing integrated circuits, because the required amount of testing time is inefficient for testing modern circuit designs.

Increasing the number of scan chains would reduce the maximum length of a scan chain, thus reducing the number of test cycles required to shift data through the chains. This directly impacts the test cost by reducing the test application time, but has no affect on the test data required to be stored in tester memory. However, conventional approaches fail to efficiently and cost-effectively do this.

For example, on-chip pseudo-random test generators based on Linear Feedback Shift Register (LFSR) or some derivation of it, are classified as Logic BIST techniques which are able to generate test vectors on chip. Hence, they can drive many more parallel scan chains. The data at the output of the chains is fed into an on-chip logic which computes a signature for the output response. This signature is finally serially shifted out to check the test response, or compared against the expected value stored on chip. For a given number of vectors, it would allow one to reduce the test application time, as well as test data required to be stored in tester memory. However, due to the randomness of the generated test patterns, the test quality is degraded. Such techniques are not able to achieve test results having a sufficient level of fault coverage for random logic designs.

Another method uses a hybrid approach of an LFSR based on-chip test generator, and an external scan based ATPG [1-7] tool. This uses the on-chip LFSR based test generator to drive several parallel scan chains. The ATPG tool is used to target test vectors that can be generated through the LFSR. Additional methods based on this hybrid approach add flexibility to the testing by several different techniques to allow generation of suitable test vectors, such as changing the state of the LFSR (also known as reseeding the LFSR), reconfiguring the LFSR by controlling the feedback taps on the LFSR, or by adding a phase-shifter at the output of the LFSR to change certain outputs of the LFSR as desired.

However, the hybrid techniques are inefficient, because designing the on-chip test generator, and modifying conventional ATPG tools to derive necessary seeds and/or feedback taps, are both expensive processes.

SUMMARY OF THE INVENTION

A method of test compaction using linear matrix driven scan chains includes dividing pins of an integrated circuit into a first group and a second group, logically associating each pin of the first group to each pin of the second group, and generating a scan chain in the integrated circuit for each logical association of pins.

DETAILED DESCRIPTION

A linear matrix testing technique for an integrated circuit can be used to drive many parallel scan chains with a handful of chip pins, and can use a scan-based automatic test pattern generator (ATPG) tool to generate high quality test vectors. The linear matrix based methodology compacts the testing of application specific integrated circuit (ASIC) designs. For example, when compared to conventional scan methods, the linear matrix based approach reduces the test application time as well as the required tester memory and test data by an order of magnitude or greater without deteriorating the test quality.

To provide this test compaction, a linear matrix is used to drive a large number of parallel scan chains from a small set of chip pins. A multiple input shift register (MISR) may be used at the end of each chain to receive and compress the output response of scan chains By increasing the number of parallel scan chains, the size of the longest scan chain is reduced which directly impacts the number of test cycles required to shift data through the chains. This allows the test application time required for shifting data through scan chains to be considerably reduced, by a factor of 10 to 50 or more, depending upon the size of the design and available pins for test. It also reduces the test data required to be stored in the ATPG tester's memory. This considerably reduces the manufacturing test cost, and allows the reuse of older generation testers, which have smaller memories than newer testing tools, and are therefore less expensive. This technique can also be applied to reduced-tester-pin-count-testing, which is an attractive approach to test bare dies before it is packaged.

Linear-Matrix Driven Scan Chain Design

Figure 1:
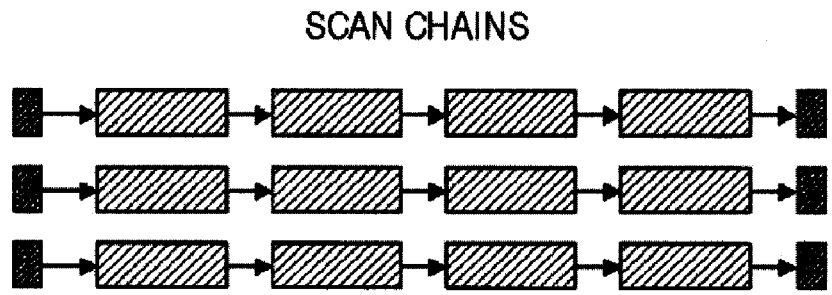
FIG. 1 shows a conventional scan design uses available scan pins to drive scan chains, where each chain requires one scan-in and one scan out pin.
Figure 2:
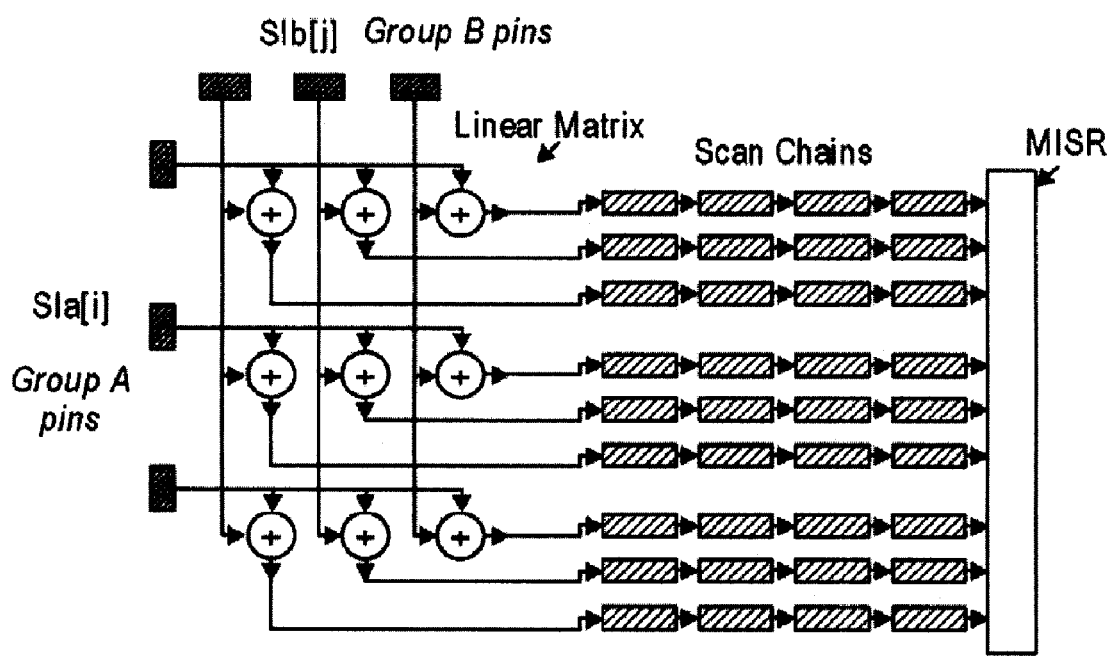
FIG. 2 shows an example of a linear matrix, driven by scan pins, to drive a large number of internal scan chains.

The test compaction technique uses a linear matrix, driven by scan pins (which can be shared with functional pins), to drive a large number of internal scan chains, as shown in FIG. 2. The linear matrix is obtained by first dividing the available test pins into two groups, Group A and Group B. Scan chains are driven by ExORing the scan pins from these two groups. Let Group A contain "n" pins, and Group B contain "m" pins. These pins can be used to drive n*m chains as follows:

Let the pins in Group A be represented as $SIa[i]$, i: 1 to n
Let the pins in Group B be represented as $SIb[j]$, j: 1 to m
Let the scan-in of (n*m) chains be represented as $C[i][j]$, i: 1 to n, j: 1 to m;
Each $C[i][j]$ is obtained by performing ExOR on input $SIa[i]$ and $SIb[j]$, i.e.

$$C[i][j] <= SIa[i] \text{ ExOR } SIb[j], \text{ i ranges from 1 to n, j ranges from 1 to m.} \quad (1)$$

The number of chains driven by the matrix can be controlled by the distribution of the available scan pins in the two groups (Group A and Group B). To get a maximum number of scan chains, the pins may be divided equally between the two groups, i.e. for optimal results, either n=m, or n=m+1. Therefore, as shown in FIG. 2, the linear matrix driven (n*m) scan chains, gives 9 chains from 6 pins Using a linear ExOR matrix to drive internal scan chains may affect the independence of the individual bits being scanned into these chains at a given instant. However, due to the fact that for any given fault in a design, only a few scan bits may need to be set to specific values, there may be practically little to no degradation in the test quality. An ATPG program is used to generate a test vector that determines the scan inputs for each chain $C[i][j]$. Equation 1 above is used to determine the values for $SIa[i]$ and $SIb[j]$ which, when applied to an ExOR operation, cause the generated test vector values to be applied to the input of the scan chain $C[i][j]$. Unspecified bits may be filled with random values.

Figure 3:
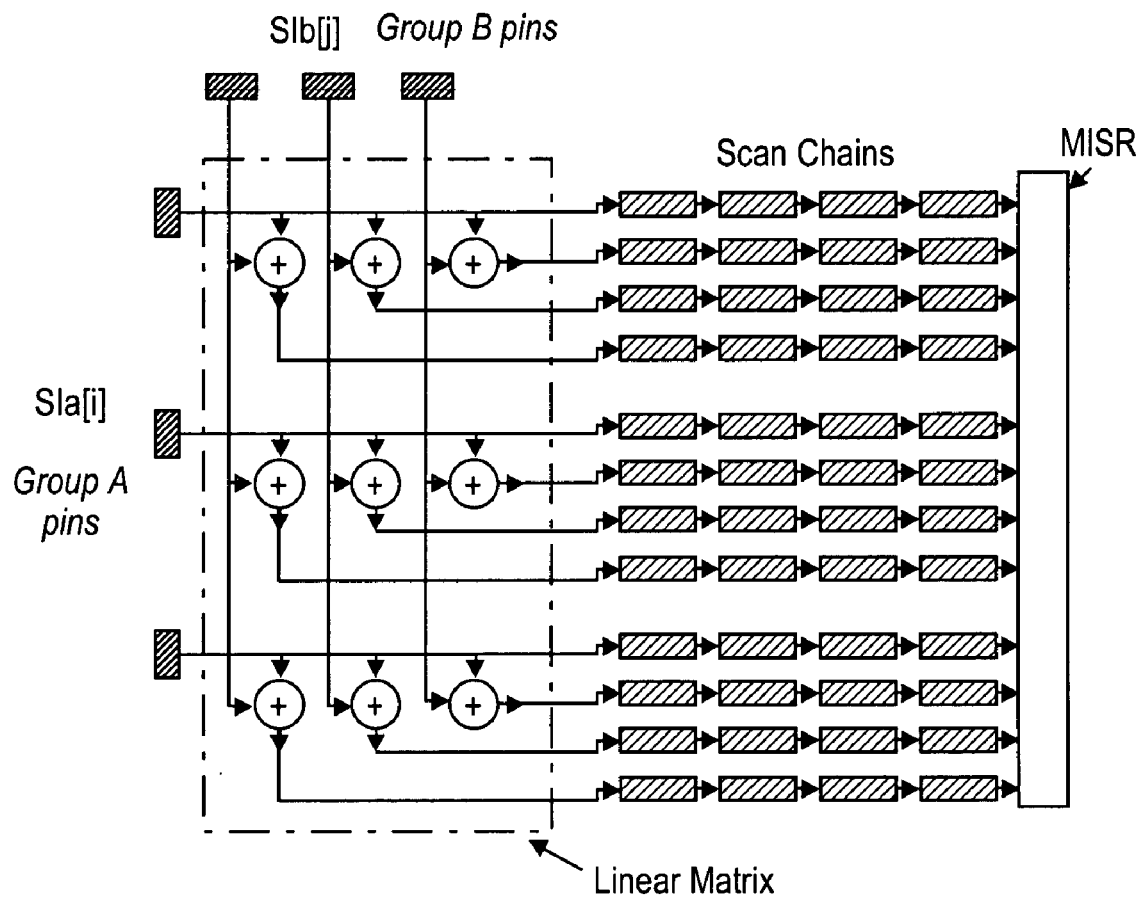
FIG. 3 shows another example of a linear matrix, driven by scan pins, to drive a large number of internal scan chains.

The number of internal chains can be further increased by directly driving additional n chains from Group A scan pins, as shown in FIG. 3, without further limiting the independence of bits being scanned, as follows:

$$C[i][j] <= SIa[i] \text{ ExOR } SIb[j], \text{ i ranges from 1 to n, j ranges from 1 to m.}$$

$$C[i][j] <= SIa[i], \text{ i ranges from 1 to n, j=m+1 giving a total of n*(m+1) chains.} \quad (2a)$$

Alternatively, this can be represented as $$C[i][j] <= SIa[i] \text{ ExOR } SIb[j], \text{ i ranges from 1 to n, j ranges from 1 to m+1, with } SIb[m+1]=0. \quad (2b)$$

$SIb[m+1]$ may be assumed to be 0, because, if for some vector $C[i][j]$, $SIb[m+1]$ is set to 1, the same solution $C[i][j]$ may be obtained by inverting each of $SIa[i]$ and $SIb[j]$, thus resetting $SIb[m+1]$ to 0. Since both $SIa[i]$ and $SIb[j]$ are inverted, their ExOR result $C[i][j]$ remains unchanged. Since $SIb[m+1]$ is assumed to 0, no external test pin is required to drive this signal.

A trade off in the number of scan chains, and the relative dependence between the bits being scanned may be made by changing the distribution of pins in Group A and Group B. Choosing m=0 reduces the design to conventional scan designs driving the minimal number of chains. The optimal number of scan chains may be achieved when n=m or n=m+1. However, there may be practically little or no degradation in test quality or increase in test vectors, as there is sufficient independence in the vectors that can be driven by the linear matrix.

Output data at internal scan-out pins of each chain is shifted into a multi-input shift register (MISR) of appropriate length. The final state of the MISR that represents the signature of the test response, is either serially shifted out, or is compared with the expected golden signature stored on chip.

The increase in the number of chains, the reduction in chain length, the reduction in the number of shift cycles, and the reduction in the amount of tester memory, when using the Test Compaction approach, is shown in Table 1, where F is the number of flip-flops in a design; P is the number of pins available to access chains; and V is the number of vectors.

TABLE 1

|  | Conventional Scan | Linear Matrix Scan |
| --- | --- | --- |
| Number of chains | k | k * (k + 1) where k = P/2 |
| Maximum chain length | F/k | F/(k * (k + 1)) |
| Number of shift cycles | V * F/k | V * (F/(k * (k + 1)) + 1) |
| Tester scan memory | 2 * V * F | 2 * V * (F/(k + 1)) + L |

Thus, both the tester data, as well as the number of tester cycles used to perform the test is reduced by a factor of k. Table 2 shows an example of the reduction in manufacturing costs when using the test compaction approach. Assuming F=40,000; P=40; V=10,000, and test time costs 10¢/sec, then:

TABLE 2

|  | Conventional Scan | Linear Matrix Scan | Advantage Factor |
| --- | --- | --- | --- |
| Number of chains | 20 | 400 | 20 |
| Maximum chain length | 2000 | 100 | 20 |
| Number of cycles | 20 Million | 1 Million | 20 |
| Tester scan memory | 800 Mb | 40 Mb | 20 |
| Test time (10 MHz) | 2 sec | 0.1 sec | 20 |
| Test cost for 1 M chips (Assuming) | $2 M | $100K | 20 |

The linear matrix based scheme can therefore significantly reduce the amount of tester memory and the amount of test time, thus reducing the overall manufacturing test cost.

Multidimensional Extension

The linear matrix based approach can be extended to a linear matrix having more than two dimensions by dividing the pins into more than two groups, and driving the scan chains with an ExOR matrix that is connected to a pin from each group. For example, if the available pins are divided into three groups, A, B and C, such that $SIa[i]$ represents pins in Group A, $SIb[j]$ represents pins in group B, and $SIc[k]$ represents pins in group C, then the inputs to a chain can be represented as $C[i][j][k]$:

$$C[i][j][k] <= SIa[i] \text{ ExOR } SIb[j] \text{ ExOR } SIc[k]. \quad (3)$$

This allows (P/3)*(P/3)*(P/3) chains to be driven from P pins. In general, dividing the pins into n groups having an approximately equal number of pins, and using an n-dimensional linear matrix, allows (P/n)*(P/n) ... (P/n) chains to be driven. In other words, the number of chains is equal to (P/n)^n, i.e. (P/n) raised to the power of n, where P is the total number of pins on the chip, and n is the number of groups of pins.

Figure 4:
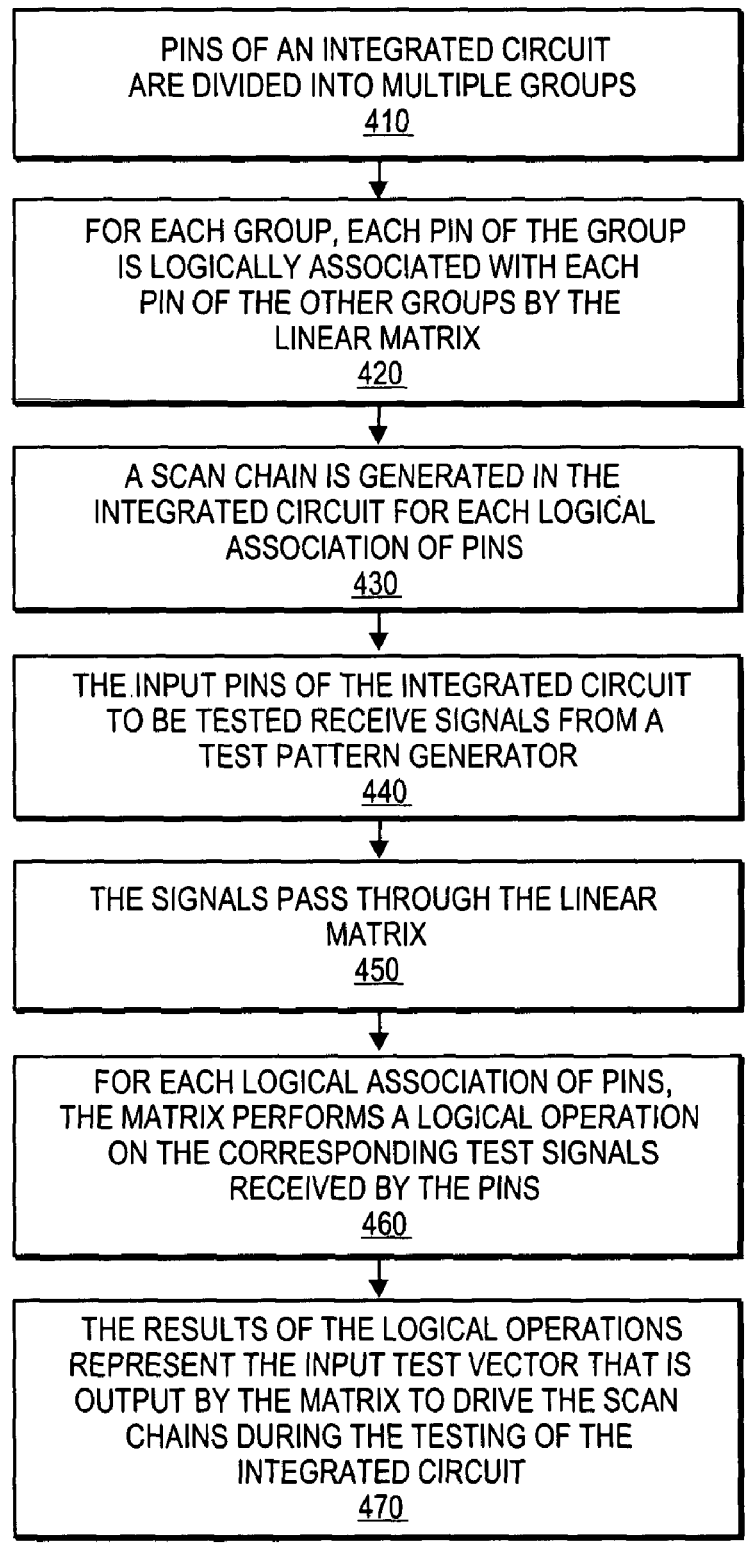
FIG. 4 shows an example of a method of performing linear matrix based test compaction.

FIG. 4 shows an example of a method of performing linear matrix based test compaction. Pins of an integrated circuit are divided into multiple groups, 410. For each group, each pin of the group is logically associated with each pin of the other groups by the linear matrix, 420. A scan chain is generated in the integrated circuit for each logical association of pins, 430. The input pins of the integrated circuit to be tested receive signals from a test pattern generator, 440. The signals pass through the linear matrix, 450. For each logical association of pins, the matrix performs a logical operation on the corresponding test signals received by the pins, 460. The results of the logical operations represent the input test vector that is output by the matrix to drive the scan chains during the testing of the integrated circuit, 470.

Testability of the Linear Matrix

The linear matrix that drives the scan chains is itself easy to test. It is directly controllable from chip pins, and is observable through the scan chains that it feeds. In fact Table 3 shows the combinations of input vectors at Group A and Group B pins that would test the entire linear matrix for single stuck-at faults.

TABLE 3

| Group A (SIa[i] pins) | Group B (SIb[j] pins) |
| --- | --- |
| 1 | 0 |
| 1 | 1 |
| 0 | 1 |
| 0 | 0 |

A method of test compaction using linear matrix driven scan chains includes dividing pins of an integrated circuit into a first group and a second group, logically associating each pin of the first group to each pin of the second group, and generating a scan chain in the integrated circuit for each logical association of pins. The linear matrix scheme of test compaction uses an ExOR matrix to drive the chains, using one ExOR gate per chain. It may use a MISR at the scan-chain outputs.

The test compaction technique can be used to perform reduced-test-pin-count testing. The linear matrix based approach to test compaction reduces the number of cycles required to shift scan data through the chains. It reduces the required number of scan data bits to be stored on an ATE. It retains high fault coverage as opposed to Logic BIST based schemes where the fault coverage is usually not as high for random logic designs. The technique may be performed without an LFSR or on-chip test generator.

Linear matrix based test compaction may be performed using a combination of hardware logic and computer software programs which are stored in a computer readable medium and executed by a computer processing system. For example, the linear matrix may be implemented as an electronic circuit that receives patterns to be input to the scan chains from an Automatic Test Pattern Generator, which is implemented as a computer software program stored in a computer readable memory and executed by a computer processing system.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. An apparatus comprising:
   means for dividing p pins of an integrated circuit into n groups;
   means for logically associating the pins of each group through an ExOR matrix; and
   means for driving a plurality of scan chains in the integrated circuit with the logically associated pins, wherein the plurality of scan chains are driven by ExORing the pins from the n groups, and the ExOR matrix is configured such that the number of pins logically associated through the ExOR matrix is less than the number of scan chains coupled to the ExOR matrix.

2. The apparatus of claim 1, wherein said means for logically associating the pins further comprises:
   means for generating (p/n)^n logical associations, where p is the number of pins, and n is the number of groups of pins 3. The apparatus of claim 1, wherein the number of scan chains is equal to the number of logical associations.

4. The apparatus of claim 1, wherein the ExOR matrix has n dimensions.

5. A computer readable memory having stored thereon a computer program which, when executed by a processor, causes the execution of a process, the memory comprising:
   code for dividing p pins of an integrated circuit into n groups;
   code for logically associating the pins of each group through an ExOR matrix;
   code for driving a plurality of scan chains in the integrated circuit with the logically associated pins, wherein the plurality of scan chains are driven by ExORing the pins from the n groups, and the ExOr matrix is configured such that the number of pins logically associated through the ExOR matrix is less than the number of scan chains coupled to the ExOR matrix; and
   code for storing a result of a logical operation performed by the ExOR matrix.

6. The memory of claim 5, wherein said code for logically associating the pins further comprises:
   code for generating (p/n)^n logical associations, where p is the number of pins, and n is the number of groups of pins.

7. The memory of claim 5, wherein the number of scan chains is equal to the number of logical associations.

8. The memory of claim 5, wherein the ExOR matrix has n dimensions.

9. A method comprising:
   dividing p pins of an integrated circuit into n groups;
   logically associating the pins of each group through an ExOR matrix; and
   driving a plurality of scan chains in the integrated circuit with the logically associated pins, wherein the plurality of scan chains are driven by ExORing the pins from the n groups, and the ExOR matrix is configured such that the number of pins logically associated through the ExOR matrix is less than the number of scan chains coupled to the ExOR matrix.

10. The method of claim 9, wherein said logically associating the pins further comprises:
generating $(p/n)^n$ logical associations, where p is the number of pins, and n is the number of groups of pins.

11. The method of claim 9, wherein the number of scan chains is equal to the number of logical associations.

12. The method of claim 9, wherein the ExOR matrix has n dimensions.

* * * * *

UNITED STATES PATENT AND TRADEMARK OFFICE
CERTIFICATE OF CORRECTION

PATENT NO. : 7,584,392 B2
APPLICATION NO. : 10/630537
DATED : September 1, 2009
INVENTOR(S) : Sandeep Bhatia It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 605 days.

Signed and Sealed this

Fourteenth Day of September, 2010

David J. Kappos
*Director of the United States Patent and Trademark Office*